US010420235B2

United States Patent
Park et al.

(10) Patent No.: US 10,420,235 B2
(45) Date of Patent: Sep. 17, 2019

(54) ELECTRONIC DEVICE INCLUDING CAPACITANCE GENERATING DEVICE

(71) Applicant: Samsung Electronics Co., Ltd., Suwon-si, Gyeonggi-do (KR)

(72) Inventors: Sung-Won Park, Suwon-si (KR); Seungyup Lee, Hwaseong-si (KR); Sangil Lee, Suwon-si (KR); Won-Jea Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 25 days.

(21) Appl. No.: 15/184,292

(22) Filed: Jun. 16, 2016

(65) Prior Publication Data

US 2017/0020012 A1 Jan. 19, 2017

(30) Foreign Application Priority Data

Jul. 13, 2015 (KR) .................. 10-2015-0099078

(51) Int. Cl.
*H05K 5/02* (2006.01)
*H01G 2/10* (2006.01)
(Continued)

(52) U.S. Cl.
CPC ......... *H05K 5/0247* (2013.01); *G06F 1/1656* (2013.01); *H01G 2/106* (2013.01); *H01G 4/01* (2013.01); *H01G 4/224* (2013.01); *H01G 4/228* (2013.01); *H01M 10/4264* (2013.01); *H04B 1/3888* (2013.01); *H04M 1/0277* (2013.01); *H04M 1/185* (2013.01);
(Continued)

(58) Field of Classification Search
CPC ......... H05K 5/0247; H05K 2201/0999; H05K 5/0013; H05K 5/04; H04M 1/0277; H04M 1/185; G06F 1/1656; H01M 10/4264; H01M 16/00; H01G 4/30; H01G 4/224; H01G 2/10; H01G 4/228; H01G 4/01; H01G 2/106; H04B 1/3888
See application file for complete search history.

(56) References Cited

U.S. PATENT DOCUMENTS 5,413,950 A * 5/1995 Chen ................. H01L 27/10817
257/E21.012
9,985,341 B2 * 5/2018 Shewan ................. H01Q 1/273
(Continued)

FOREIGN PATENT DOCUMENTS

| CN | 102637658 A | 8/2012 |
|---|---|---|
| KR | 10-2014-0036426 A | 3/2014 |
| KR | 10-2015-0026004 A | 3/2015 |

OTHER PUBLICATIONS

STIC Search Report.*

*Primary Examiner* — Steven T Sawyer
*Assistant Examiner* — Sagar Shrestha
(74) *Attorney, Agent, or Firm* — Jefferson IP Law, LLP

(57) ABSTRACT

An electronic device is provided. The electronic device includes a first metal plate of a metal bezel that forms the external appearance of the electronic device, a second metal plate that overlaps the first metal plate while being spaced apart from the first metal plate, a dielectric member interposed between the first metal plate and the second metal plate, and a substrate electrically connected to a contact terminal of the second metal plate to feed power. Other embodiments are possible.

14 Claims, 21 Drawing Sheets

(51) Int. Cl.
*H01G 4/01* (2006.01)
*H01G 4/224* (2006.01)
*H01G 4/228* (2006.01)
*H01M 10/42* (2006.01)
*G06F 1/16* (2006.01)
*H04B 1/3888* (2015.01)
*H04M 1/02* (2006.01)
*H04M 1/18* (2006.01)
*H05K 5/00* (2006.01)
*H05K 5/04* (2006.01)
*H01M 16/00* (2006.01)

(52) U.S. Cl.
CPC ............ *H05K 5/0013* (2013.01); *H05K 5/04* (2013.01); *H01M 16/00* (2013.01); *H05K 2201/0999* (2013.01)

(56) References Cited

U.S. PATENT DOCUMENTS

| | | | |
|---|---|---|---|
| 2004/0256738 A1 | 12/2004 | Pavier et al. | |
| 2006/0097305 A1* | 5/2006 | Lee | C23C 16/0236 257/310 |
| 2008/0218183 A1* | 9/2008 | Sato | H03K 17/962 324/686 |
| 2010/0238602 A1* | 9/2010 | Capanu | H01G 7/06 361/277 |
| 2011/0152959 A1 | 6/2011 | Sherwood et al. | |
| 2013/0257659 A1* | 10/2013 | Darnell | H01Q 1/243 343/702 |
| 2014/0160704 A1* | 6/2014 | Janssen | H01G 2/06 361/759 |
| 2014/0311787 A1 | 10/2014 | Park et al. | |
| 2015/0173245 A1 | 6/2015 | Chung et al. | |
| 2016/0006110 A1* | 1/2016 | Jain | H01Q 5/328 343/702 |

* cited by examiner

ELECTRONIC DEVICE INCLUDING CAPACITANCE GENERATING DEVICE

CROSS-REFERENCE TO RELATED APPLICATION(S)

This application claims the benefit under 35 U.S.C. § 119(a) of a Korean patent application filed on Jul. 13, 2015 in the Korean Intellectual Property Office and assigned Serial number 10-2015-0099078, the entire disclosure of which is hereby incorporated by reference.

TECHNICAL FIELD

The present disclosure relates to an electronic device. More particularly, the present disclosure relates to an electronic device that includes a capacitance generating device.

BACKGROUND

Electronic devices having various functions (such as cellular phones, electronic organizers, personal compound terminals, laptop computers, etc.) have emerged with the development of electronic communication technologies. These electronic devices have become necessities of modern life and have become an important means for delivering fast changing information.

As the functional differences between electronic devices of respective manufacturers have recently been greatly reduced, the manufacturers tend to make an effort to increase the rigidity of the electronic devices, which are being gradually slimmed in order to satisfy consumers' purchasing needs, and to strengthen the design features of the electronic devices. Reflecting this trend, various structures (e.g., exteriors) of the electronic devices are at least partially implemented using a metal material so as to appeal to the luxuriousness of the electronic devices and to the elegance of the exterior thereof. Further, the manufacturers have made an effort to solve, for example, a ground problem (e.g., an electric shock) and the problem of reduced antenna radiating performance, which are encountered when a metal material is used.

The above information is presented as background information only to assist with an understanding of the present disclosure. No determination has been made, and no assertion is made, as to whether any of the above might be applicable as prior art with regard to the present disclosure.

SUMMARY

In the related art, in order to prevent a degradation in antenna radiating performance, and damage to a product and an electric shock due to an over-current, which are generated by implementing a part of the external appearance of an electronic device with metal, the electronic device includes, for example, capacitors on a substrate (e.g., a printed circuit board (PCB)) of the electronic device to avoid the degradation in antenna radiating performance and the damage to the product and the electric shock due to the over-current. The capacitors are generally mounted on the substrate of the electronic device in consideration of the damage to the capacitors due to an external shock or static electricity. However, in a case where the electronic device is charged while the capacitors are all damaged, an over-current is introduced into the electronic device from the outside (e.g., a charging device, etc.), which causes damage to the product and an electric shock accident.

In order to solve the above problems, various embodiments of the present disclosure provide a device for preventing a degradation in antenna performance.

In order to solve the above problems, various embodiments of the present disclosure provide a device for reducing an over-current that enters an electronic device.

Aspects of the present disclosure are to address at least the above-mentioned problems and/or disadvantages and to provide at least the advantages described below. Accordingly, an aspect of the present disclosure is to provide an electronic device, according to various embodiments of the present disclosure, includes a first metal plate of a metal bezel that forms the external appearance of the electronic device, a second metal plate that overlaps the first metal plate while being spaced apart from the first metal plate, a dielectric member interposed between the first metal plate and the second metal plate, and a substrate electrically connected to a contact terminal of the second metal plate to feed power.

In accordance with an aspect of the present disclosure, at least a part of the bezel that forms the external appearance of the electronic device is implemented as a capacitor for antenna performance, which makes it possible to prevent damage to the product and an electric shock caused by an over-current, enhance the antenna performance (the regulation of a frequency band), and save space according to the installation of the capacitor.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
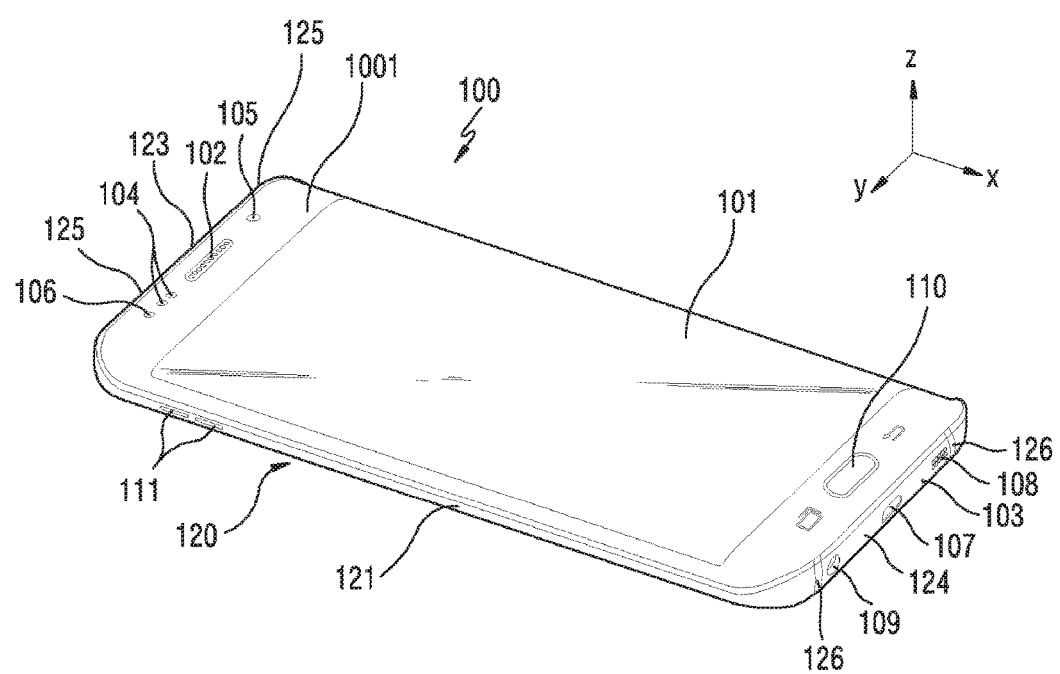
FIG. 1 is a front perspective view of an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used in the present disclosure are only used to describe specific embodiments, and are not intended to limit the present disclosure. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a digital versatile disc (DVD) player, an audio, a refrigerator, an air conditioner, a vacuum cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ and Play Station™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, and the like.).

According to various embodiments of the present disclosure, the electronic device may include at least one of a part of furniture or a building/structure, an electronic board, an electronic signature receiving device, a projector, and various kinds of measuring instruments (e.g., a water meter, an electric meter, a gas meter, and a radio wave meter and the like). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

FIG. 1 is a front perspective view of an electronic device according to various embodiments of the present disclosure.

Figure 2:
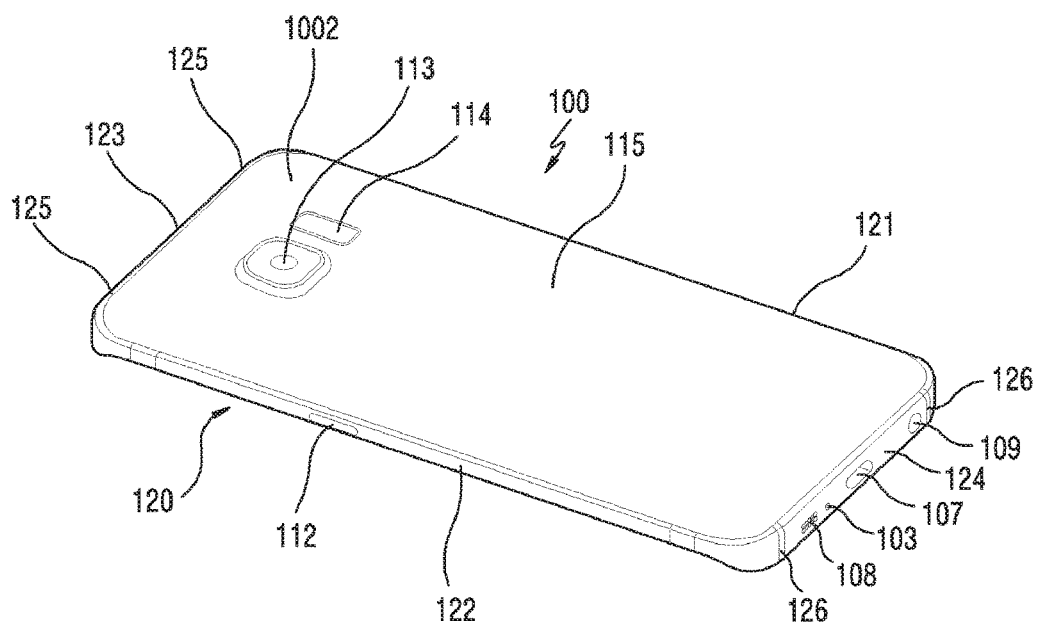
FIG. 2 is a rear perspective view of the electronic device according to the various embodiments of the present disclosure.

FIG. 2 is a rear perspective view of the electronic device according to the various embodiments of the present disclosure.

Figure 3:
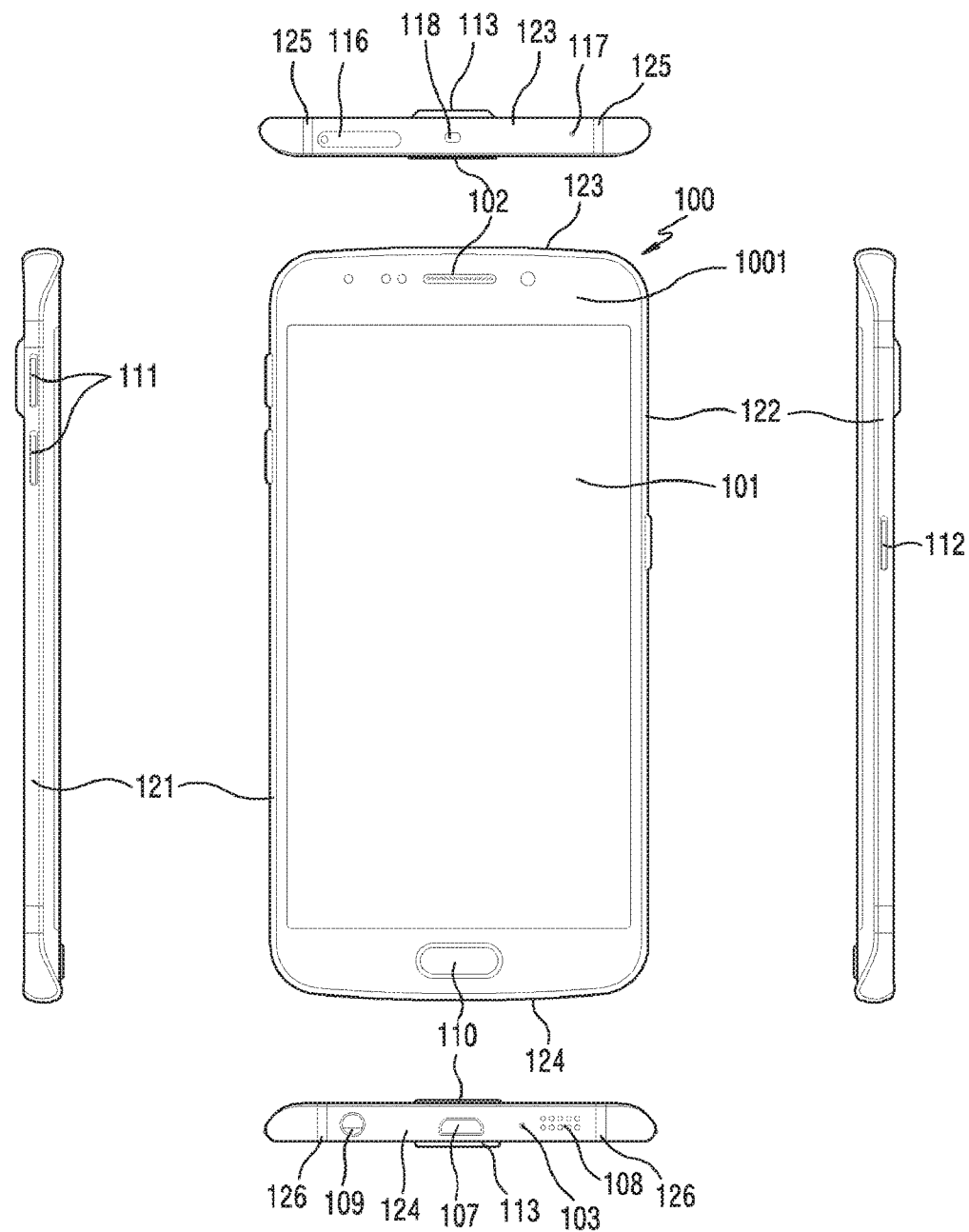
FIG. 3 are various views of the electronic device, according to the various embodiments of the present disclosure, when viewed in various directions.

FIG. 3 contain various views of the electronic device, according to the various embodiments of the present disclosure, when viewed in various directions.

Referring to FIGS. 1, 2, and 3, a display module 101 may be mounted on the front 1001 of the electronic device 100. A receiver 102 for receiving a counterpart's voice may be disposed on the upper side of the display module 101. A microphone device (not illustrated) for transmitting, to the counterpart, the voice of a user that uses the electronic device 100 may be disposed on the lower side of the display module 101.

According to an embodiment of the present disclosure, components for performing various functions of the electronic device 100 may be disposed around the receiver 102. The components may include at least one sensor module 104. The sensor module 104 may include, for example, at least one of an illumination sensor (e.g., optical sensor), a proximity sensor, an infrared sensor, and an ultrasonic sensor. The components may include a front camera device 105. The components may also include an indicator 106 for allowing the user to perceive information on the state of the electronic device 100.

According to an embodiment of the present disclosure, the electronic device 100 may include a metal bezel 120 as a metal housing. The metal bezel 120 may be disposed along the outer periphery of the electronic device 100, and may also extend to at least a part of the rear of the electronic device 100, which is connected to the outer periphery of the electronic device. The metal bezel 120 may define at least a part of the thickness of the electronic device 100 along the outer periphery of the electronic device 100, and may be formed in a closed loop shape. Without being limited thereto, however, the metal bezel 120 may also be formed in such a manner that the metal bezel contributes to at least a part of the thickness of the electronic device 100. The metal bezel 120 may also be disposed only in at least a part of the outer periphery of the electronic device 100. In a case where the metal bezel 120 serves as a part of the housing of the electronic device 100, the rest of the housing may be replaced by a non-metal member. In this case, the housing may be formed in such a manner that the non-metal member is insert-molded into the metal bezel 120.

According to an embodiment of the present disclosure, the metal bezel 120 may include one or more cut-off portions 125 and 126, and may include unit bezel portions 123 and 124 that are separated by the cut-off portions 125 and 126.

The upper bezel portion 123 may serve as a unit bezel portion by a pair of cut-off portions 125 that are formed with a predetermined interval therebetween. The lower bezel portion 124 may serve as a unit bezel portion by a pair of cut-off portions 126 that are formed with a predetermined interval therebetween.

According to an embodiment of the present disclosure, the cut-off portions 125 and 126 may be formed together when the non-metal member is insert-molded into the metal member.

According to an embodiment of the present disclosure, the metal bezel 120 may have a closed loop shape along the outer periphery thereof, and may be disposed in such a manner that the metal bezel 120 contributes to the whole thickness of the electronic device 100. When the electronic device 100 is viewed from the front, the metal bezel 120 may include a left bezel portion 121, a right bezel portion 122, the upper bezel portion 123, and the lower bezel portion 124.

According to an embodiment of the present disclosure, at least one of the left bezel portion 121, the right bezel portion 122, the upper bezel portion 123, and the lower bezel portion 124 may be used as a part of an antenna device.

According to an embodiment of the present disclosure, at least one of the left bezel portion 121, the right bezel portion 122, the upper bezel portion 123, and the lower bezel portion 124 may be used as a part of an over-current interrupting device.

According to an embodiment of the present disclosure, various electronic components may be disposed in the lower bezel portion 124 of the electronic device 100. A microphone hole 103 for receiving a sound from the outside may be formed in the lower bezel portion 124. A speaker hole 108 for releasing a sound to the outside may be formed on one side of the microphone hole 103. An interface connector hole 107 may be formed on the opposite side of the microphone hole 103 in order to perform data transmission/reception with an external device and to receive external power to charge the electronic device 100. An ear-jack hole 109 for receiving an ear plug may be formed on a side of the interface connector hole 107. The microphone hole 103, the speaker hole 108, the interface connector hole 107, and the ear-jack hole 109 may all be disposed in the area of the unit bezel portion that is formed by the pair of cut-off portions 126 disposed in the lower bezel portion 124. Without being limited thereto, however, at least one of the aforementioned electronic components may be disposed in the area that includes the cut-off portions 126, or may be disposed outside the unit bezel portion. A capacitance generating device (200 of FIG. 4) of the present disclosure may be disposed in the lower bezel portion 124 of the electronic device 100. However, without being limited thereto, the capacitance generating device may also be applied to the left, right, or upper bezel portion 121, 122, or 123 of the electronic device 100. A description of the capacitance generating device, according to various embodiments of the present disclosure, will be given below.

According to an embodiment of the present disclosure, various electronic components may also be disposed in the upper bezel portion 123 of the electronic device 100. A socket device 116 into which a card-type external device is inserted may be disposed in the upper bezel portion 123. The socket device 116 may receive at least one of a unique ID card (e.g., a subscriber identification module (SIM) card, a user identity module (UIM) card, etc.) for electronic device 100 and a memory card for increasing storage space. An infrared sensor module 118 may be disposed on a side the socket device 116, and an auxiliary microphone device 117 may be disposed on a side of the infrared sensor module 118. The socket device 116, the infrared sensor module 118, and the auxiliary microphone device 117 may all be disposed in the area of the unit bezel portion that is formed by the pair of cut-off portions 125 disposed in the upper bezel portion 123. Without being limited thereto, however, at least one of the aforementioned electronic components may be disposed in the area that includes the cut-off portions 125, or may disposed outside the cut-off portions.

According to an embodiment of the present disclosure, one or more first side key buttons 111 may be disposed in the left bezel portion 121 of the metal bezel 120. The first side key buttons 111 may be disposed in pairs in the left bezel portion 121, each of which has a portion protruding from the left bezel portion 121, and may be configured to perform a volume up/down function, a scroll function, etc. At least one second side key 112 may be disposed in the right bezel portion 122 of the metal bezel 120. The second side key button 112 may be configured to perform a power on/off function, a wake-up/sleep function of the electronic device, etc. At least one key button 110 may be disposed in at least a part of the area on the lower side of the display module 101 on the front 1001 of the electronic device 100. The key button 110 may perform a home key button function. A fingerprint recognition sensor device may be disposed on the top of the home key button. The home key button may be configured to perform a first function (a home screen return function, a wake-up/sleep function, etc.) by physically pressing the home key button and to perform a second function (e.g., a fingerprint recognition function, etc.) by swiping the top of the home key button. Although not illustrated, touch pads may be disposed on the left and right sides of the key button 110 to perform a touch function.

According to an embodiment of the present disclosure, a rear camera device 113 may be disposed on the rear 1002 of the electronic device 100, and at least one electronic component 114 may be disposed on a side of the rear camera device 113. The electronic component 114 may include at least one of an illumination sensor (e.g., an optical sensor), a proximity sensor (e.g., an optical sensor), an infrared sensor, an ultrasonic sensor, a heart-rate sensor, and a flash device.

Figure 4:
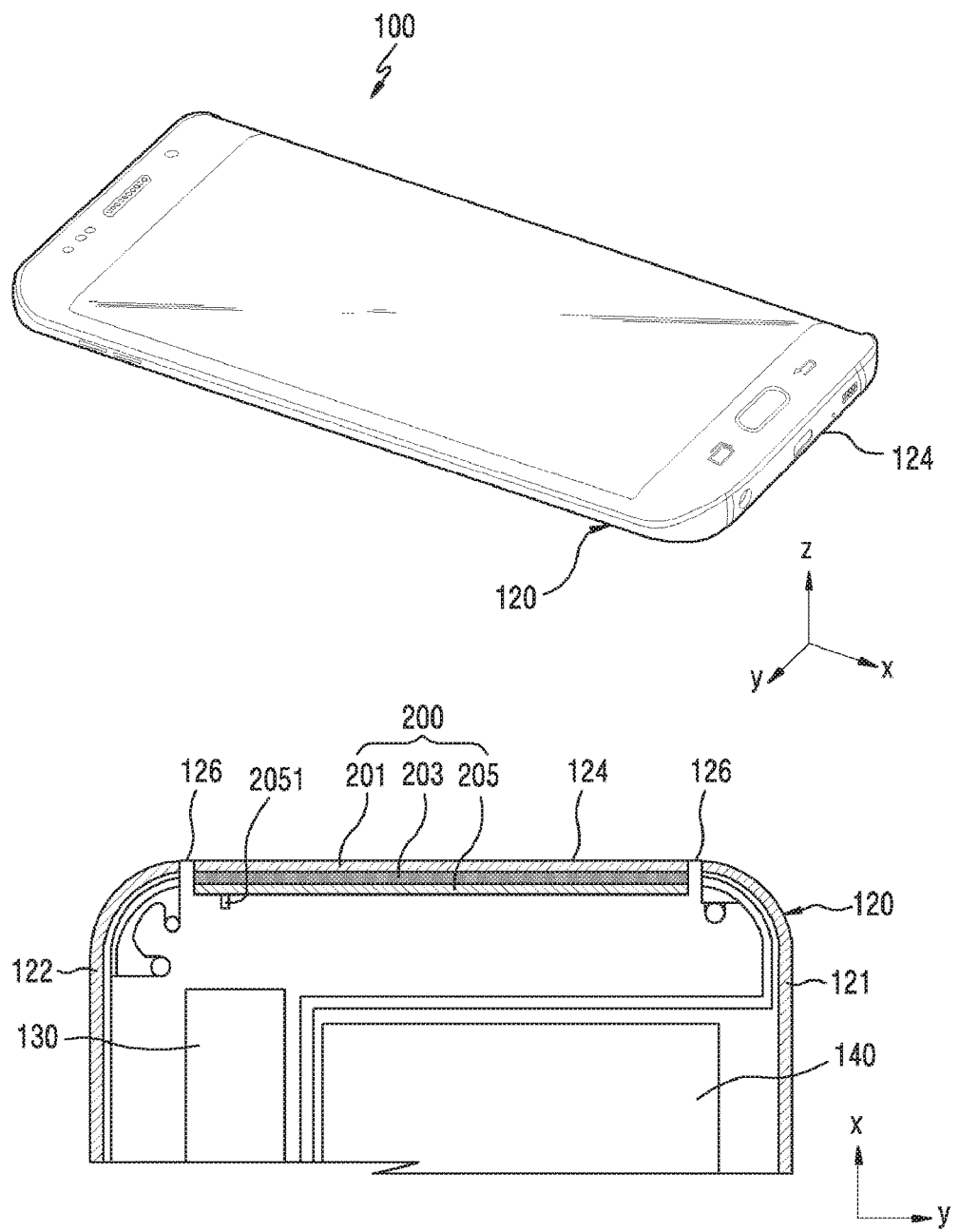
FIG. 4 is a sectional view illustrating the structure of a capacitance generating device according to various embodiments of the present disclosure.
Figure 5:
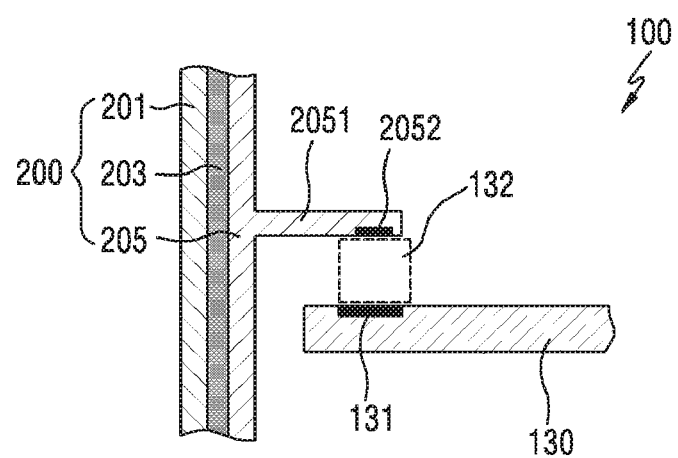
FIG. 5 is a sectional view illustrating a structure in which the capacitance generating device, according to the various embodiments of the present disclosure, is electrically connected to a substrate.

FIG. 4 is a sectional view illustrating the structure of a capacitance generating device according to various embodiments of the present disclosure. FIG. 5 is a sectional view illustrating a structure in which the capacitance generating device, according to the various embodiments of the present disclosure, is electrically connected to a substrate.

Referring to FIGS. 4 and 5, the capacitance generating device 200, according to an embodiment of the present disclosure, may include at least a part of the metal bezel 120 that is disposed on the outer periphery of the electronic device 100. For example, the capacitance generating device 200, according to the embodiment of the present disclosure, may use at least one of the left bezel portion 121, the right bezel portion 122, the upper bezel portion 123, and the lower bezel portion 124 of the metal bezel 120.

According to an embodiment of the present disclosure, the capacitance generating device 200 may include the lower bezel portion 124. Here, the lower bezel portion 124 is disposed between the left bezel portion 121 and the right bezel portion 122, and may be physically separated from the left bezel portion 121 and the right bezel portion 122.

According to an embodiment of the present disclosure, the capacitance generating device 200 may include a first metal plate 201, a second metal plate 205, and a dielectric member 203.

According to an embodiment of the present disclosure, the first metal plate 201 may be at least a part that forms the external appearance of the electronic device 100, and may include, for example, the aforementioned lower bezel portion 124.

According to an embodiment of the present disclosure, the second metal plate 205 may at least partially overlap the first metal plate 201 and may be disposed inside the electronic device 100.

According to an embodiment of the present disclosure, the first metal plate 201 and the second metal plate 205 may have the shape of a straight line. Further, the first metal plate 201 and the second plate 205 may be disposed substantially parallel to each other, and the distance therebetween may be constant. Alternatively, the distance between the first metal plate 201 and the second metal plate 205 may not be constant.

According to an embodiment of the present disclosure, the surfaces of the first and second metal plates 201 and 205 that face each other may be formed to be engaged with each other. For example, a first surface of the first metal plate 201 that faces the second plate 205 may be a curved surface, and a second surface of the second metal plate 205 that faces the first metal plate 201 may also be a curved surface. Alternatively, the first surface of the first metal plate 201 that faces the second plate 205 may be an inclined surface, and the second surface of the second metal plate 205 that faces the first metal plate 201 may also be an inclined surface.

According to an embodiment of the present disclosure, the pair of surfaces of the first and second metal plates 201 and 205 that face each other may have the same shape, or may have different shapes.

According to an embodiment of the present disclosure, the pair of surfaces of the first and second metal plates 201 and 205 that face each other may have the same area, or may have different areas.

According to an embodiment of the present disclosure, the first metal plate 201 may be formed using various means, such as die casting, computerized numerical control (CNC), etc. For example, the first metal plate 201 may be prepared by: forming the metal bezel of a substantially closed-loop shape through die casting; and then separating the left and right bezel portions 121 and 122 from the metal bezel by performing cutting at the aforementioned cut-off portions 125 and 126.

According to an embodiment of the present disclosure, the dielectric member 203 may be interposed between the first metal plate 201 and the second metal plate 205. The dielectric member 203, across which a direct current (DC) current does not flow, may serve as an electrical insulator, and may include, for example, at least one of mica, paraffin, insulating oil, and air space.

According to an embodiment of the present disclosure, the dielectric member 203 may have a shape that is suitable for the space between the first metal plate 201 and the second metal plate 205.

According to an embodiment of the present disclosure, the dielectric member 203 may contain one or more nonconductive materials. For example, the dielectric member 203 may be coupled to the metal bezel 120 and may be a part of a case frame (not illustrated) that is disposed inside the electronic device 100.

According to an embodiment of the present disclosure, the first metal plate 201 may include an extension (not illustrated) that is used to electrically connect the first metal plate 120 to the substrate 130 (e.g., the main board or printed circuit board (PCB)) of the electronic device 100. The extension may extend from the substrate 130 equipped in the electronic device 100 and may be electrically connected to a power feeder (not illustrated) of the substrate using an electrical connection means. For example, the first metal plate 201 may be electrically connected to the power feeder (e.g., a conductive pad) of the substrate 130 and may receive a current from the power feeder of the substrate 130. Alternatively, the first metal plate 201 may be electrically connected to the ground unit (not illustrated) of the substrate 130.

According to an embodiment of the present disclosure, the second metal plate 205 may include an extension 2051 that is used to electrically connect the second metal plate 205 to the substrate 130 (e.g., the main board) of the electronic device 100. The extension 2051 may include a contact (terminal) 2052 that extends toward the substrate 130 equipped in the electronic device 100, and the contact 2052 may be electrically connected to a power feeder 131 of the substrate 130 using an electrical connections means 132. The power feeder 131 of the substrate 130 may be, but is not limited to, a conductive pad. For example, the second metal plate 205 may be electrically connected to the power feeder 131 (e.g., conductive pad) of the substrate 130 and may receive a current from the power feeder 131 of the substrate 130. Alternatively, the second metal plate 205 may be electrically connected to the ground unit (not illustrated) of the substrate 130.

According to an embodiment of the present disclosure, the first metal plate 201 and the second metal plate 205 may be physically separated from each other. In addition, for example, in a case where the first metal plate 201 or the second metal plate 205 receives power from the substrate 130, the first metal plate 201 and the second metal plate 205 may be electromagnetically coupled to each other, and a capacitance may be generated therebetween.

According to an embodiment of the present disclosure, the capacitance C, which is generated between the first metal plate 201 and the second metal plate 205, may be determined by Equation 1 below.

$$C = \frac{A \times \varepsilon_0 \times \varepsilon_r}{d} \quad \text{Equation 1}$$

Here, "C" denotes a capacitance value, "A" denotes the area of metal plates, "$\varepsilon r$" denotes the permittivity of a dielectric material between the two metal plates, "$\varepsilon o$" is a constant, and "d" denotes the distance (interval) between the two metal plates. For example, the capacitance may increase as the permittivity ($\varepsilon r$) of the dielectric member 203 increases, the area (A) of the two metal plates 201 and 205 increases, and the distance (d) between the two metal plates 201 and 205 decreases. Consequently, the capacitance generating device 200, according to the embodiment of the present disclosure, may generate various capacitances according to the configuration of the first metal plate 201, the second metal plate 205, and the dielectric member 203.

According to an embodiment of the present disclosure, the capacitance generating device 200 may be used as at least a part of an antenna device (not illustrated). For example, a capacitance generated from the capacitance generating device 200 may be a factor that determines the antenna resonance property of the antenna device.

According to an embodiment of the present disclosure, the capacitance generating device 200 may be used as at least a part of an over-current interrupting device. For example, a capacitance generated from the capacitance generating device 200 may reduce an over-current that enters the electronic device 100. Accordingly, it is possible to prevent a user's electric shock through the first metal plate 201 (e.g., the lower bezel portion 126) of the capacitance generating device 200.

Figure 6:
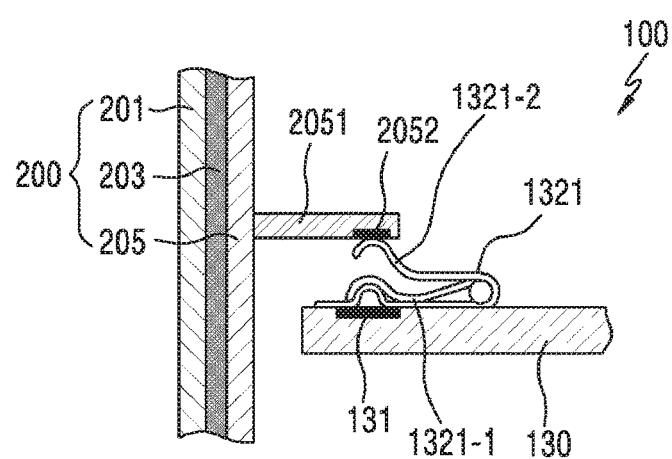
FIG. 6 is a view illustrating an electrical connection means according to various embodiments of the present disclosure.

FIG. 6 is a view illustrating an electrical connection means according to various embodiments of the present disclosure.

Referring to FIG. 6, the aforementioned electrical connection means may be a C-clip 1321.

According to an embodiment of the present disclosure, the C-clip 1321 may include a fixed end 1321-1 that is secured to the substrate 130 and is electrically connected to the power feeder 131 installed on the substrate 130 and a free end 1321-2 that is formed by bending the distal end of the C-clip and deforms in a resilient bending manner. The free end 1321-2 of the C-clip 1321 may be brought into contact with the contact 2052 installed on the extension 2051 of the second metal plate 205. Accordingly, the aforementioned C-clip 1321 may be interposed between the contact 2052 of the second metal plate 205 and the power feeder 131 of the substrate 130 to provide an effective electrical connection. In this way, the capacitance generating device 200 may receive a current from the aforementioned power feeder 131 and may oscillate at the resonance frequency by magnetic induction coupling to transmit or receive a radio-frequency signal in the corresponding frequency band.

Figure 7:
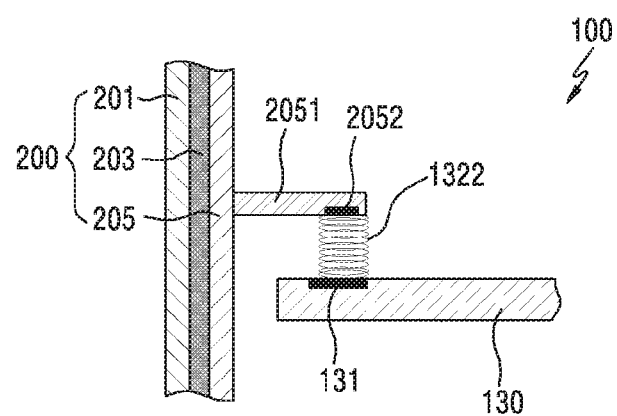
FIG. 7 is a view illustrating an electrical connection means according to various embodiments of the present disclosure.

FIG. 7 is a view illustrating an electrical connection means according to various embodiments of the present disclosure.

Referring to FIG. 7, the aforementioned electrical connection means may be a spring 1322.

According to an embodiment of the present disclosure, one end of the spring 1322 may be brought into contact with the power feeder 131 installed on the substrate 130, and the other end of the spring 1322 may be brought into contact with the contact 2052 installed on the extension 2051 of the second metal plate 205. The spring 1322 may be a coil spring, but various well-known springs may be employed. Accordingly, the aforementioned spring 1322 may be interposed between the contact 2052 of the second metal plate 205 and the power feeder 131 of the substrate 130 to provide an effective electrical connection. In this way, the capacitance generating device 200 may receive a current from the aforementioned power feeder 131 and may oscillate at the resonance frequency by magnetic induction coupling to transmit or receive a radio-frequency signal in the corresponding frequency band.

Figure 8:
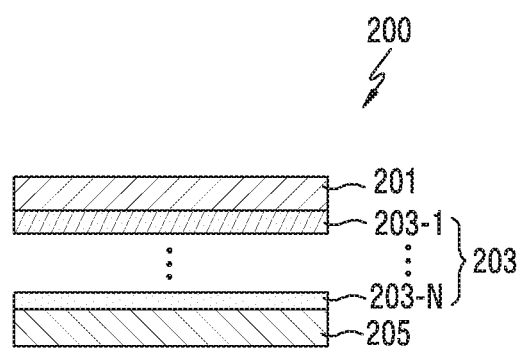
FIGS. 8, 9, 10, 11, 12, 13, 14, 15, 16, 17, 18, and 19 are views illustrating capacitance generating devices according to various embodiments of the present disclosure.

FIG. 8 is a view illustrating a capacitance generating device according to various embodiments of the present disclosure.

Referring to FIG. 8, the capacitance generating device 200 may include the first metal plate 201, the dielectric member 203, and the second metal plate 205, which have been described above. The dielectric member 203 may be interposed between the first metal plate 201 and the second metal plate 205.

According to an embodiment of the present disclosure, the dielectric member 203 may include a plurality of non-conductive materials 203-1 to 203-N. The plurality of non-conductive materials 203-1 to 203-N may be disposed in such a manner that the materials are stacked one above another. The non-conductive materials 203-1 to 203-N may contain an insulating material, such as mica, paraffin, etc. For example, the dielectric member 203 may be a stack in which different types of materials are stacked one above another.

Figure 9:
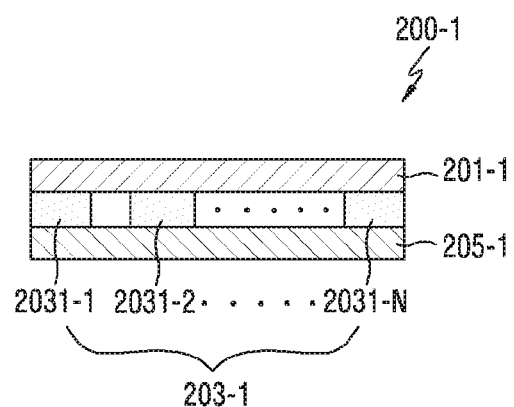

FIG. 9 is a view illustrating a capacitance generating device according to various embodiments of the present disclosure.

Referring to FIG. 9, the capacitance generating device 200-1 may include a first metal plate 201-1, a dielectric member 203-1, and a second metal plate 205-1. The dielectric member 203-1 may be interposed between the first metal plate 201-1 and the second metal plate 205-1.

According to an embodiment of the present disclosure, the dielectric member 203-1 may include a plurality of sub-dielectric members 2031-1 to 2031-N. The plurality of sub-dielectric members 2031-1 to 2031-N may be physically separated from each other.

According to an embodiment of the present disclosure, the plurality of sub-dielectric members 2031-1 to 2031-N of the dielectric member 203-1 may have the same length or different lengths.

According to an embodiment of the present disclosure, the plurality of sub-dielectric members 2031-1 to 2031-N of the dielectric member 203-1 may have the same thickness or different thicknesses.

According to an embodiment of the present disclosure, the gaps between the plurality of sub-dielectric members 2031-1 to 2031-N of the dielectric member 203-1 may be equal or unequal.

According to an embodiment of the present disclosure, the plurality of sub-dielectric members 2031-1 to 2031-N of the dielectric member 203-1 may contain the same material or different materials.

Figure 10:
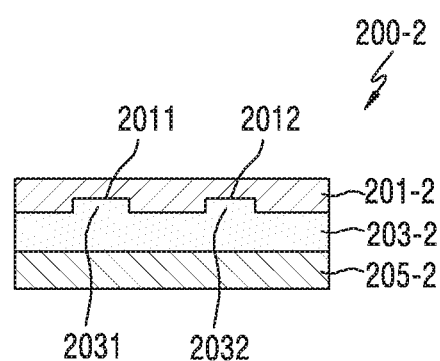

FIG. 10 is a view illustrating a capacitance generating device according to various embodiments of the present disclosure.

Referring to FIG. 10, the capacitance generating device 200-2 may include a first metal plate 201-2, a dielectric member 203-2, and a second metal plate 205-2. The dielectric member 203-2 may be interposed between the first metal plate 201-2 and the second metal plate 205-2.

According to an embodiment of the present disclosure, one or more grooves 2011 and 2012 may be formed in the direction from the first metal plate 201-2 to the second metal plate 205-2. The dielectric member 203-2 may include protrusions 2031 and 2032 that correspond to the grooves 2011 and 2012, and the protrusions 2031 and 2032 may be fixed to the grooves 2011 and 2012 in such a manner that the protrusions are inserted into the grooves. Accordingly, the dielectric member 203-2 may be firmly coupled with the first metal plate 201-2. The grooves 2011 and 2012 may have various shapes.

Figure 11:
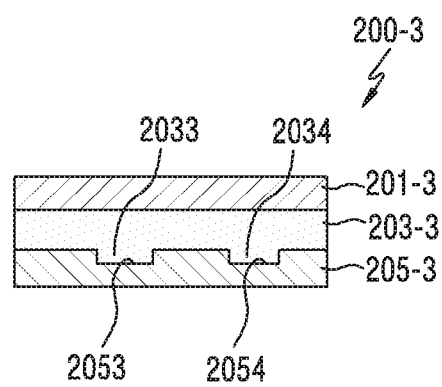

FIG. 11 is a view illustrating a capacitance generating device according to various embodiments of the present disclosure.

Referring to FIG. 11, the capacitance generating device 200-3 may include a first metal plate 201-3, a dielectric member 203-3, and a second metal plate 205-3. The dielectric member 203-3 may be interposed between the first metal plate 201-3 and the second metal plate 205-3.

According to an embodiment of the present disclosure, the second metal plate 205-3 may include one or more grooves 2053 and 2054. The dielectric member 203-3 may include protrusions 2033 and 2034 that correspond to the grooves 2053 and 2054, and the protrusions 2033 and 2034 may be inserted into the grooves 2053 and 2054. The coupling structure between the dielectric member 203-3 and the second metal plate 205-3 may increase the coupling force between the dielectric member 203-3 and the second metal plate 205-3.

FIGS. 12, 13, 14, 15, 16, and 17 are views illustrating capacitance generating devices according to various embodiments of the present disclosure.

Figure 12:
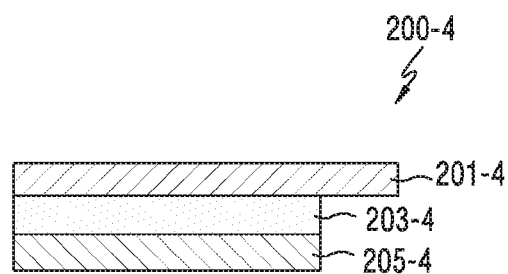

Referring to the capacitance generating device 200-4 illustrated in FIG. 12, according to an embodiment of the present disclosure, a dielectric member 203-4 may have a smaller length than a first metal plate 201-4. Alternatively, a second metal plate 205-4 may have a smaller length than the first metal plate 201-4.

Figure 13:
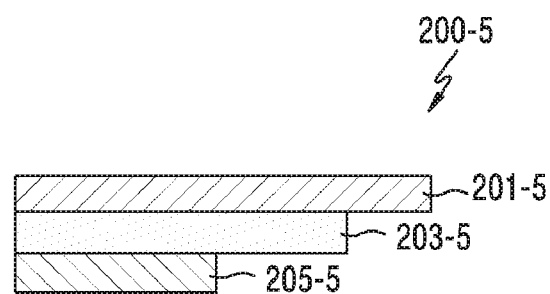

Referring to the capacitance generating device 200-5 illustrated in FIG. 13, according to an embodiment of the present disclosure, a first metal plate 201-5 may have a greater length than a dielectric material 203-5. Further, the dielectric member 203-5 may have a greater length than a second metal plate 205-5.

Figure 14:
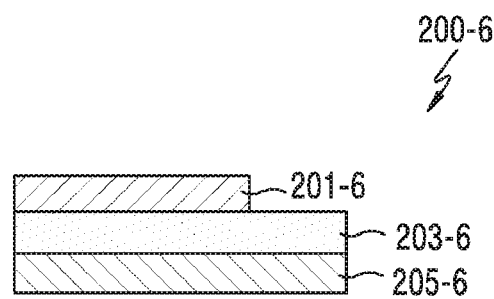

Referring to the capacitance generating device 200-6 illustrated in FIG. 14, according to an embodiment of the present disclosure, a first metal plate 201-6 may have a smaller length than a dielectric material 203-6. Further, the first metal plate 201-6 may have a smaller length than a second metal plate 205-6.

Figure 15:
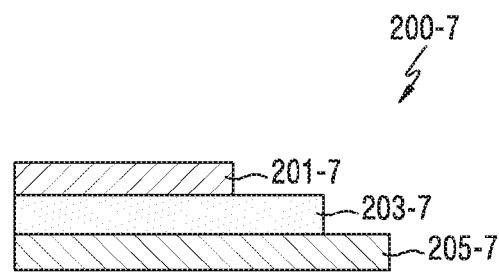

Referring to the capacitance generating device 200-7 illustrated in FIG. 15, according to an embodiment of the present disclosure, a first metal plate 201-7 may have a smaller length than a dielectric material 203-7. Further, the dielectric member 203-7 may have a smaller length than a second metal plate 205-7.

Figure 16:
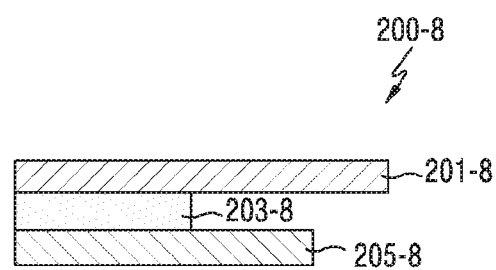

Referring to the capacitance generating device 200-8 illustrated in FIG. 16, according to an embodiment of the present disclosure, a first metal plate 201-8 may have a greater length than a dielectric material 203-8. Further, the dielectric member 203-8 may have a smaller length than a second metal plate 205-8. In addition, the first metal plate 201-8 may have a greater length than the second metal plate 205-8.

Figure 17:
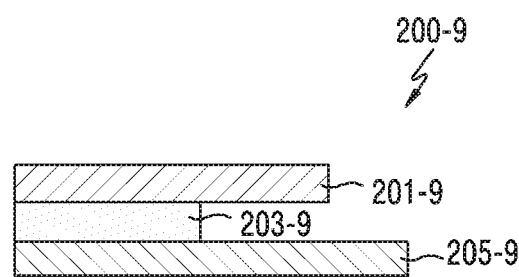

Referring to the capacitance generating device 200-9 illustrated in FIG. 17, according to an embodiment of the present disclosure, a dielectric member 203-9 may have a smaller length than a first metal plate 201-9 and a second metal plate 205-9. Further, the first metal plate 201-9 may have a smaller length than the second metal plate 205-9.

Figure 18:
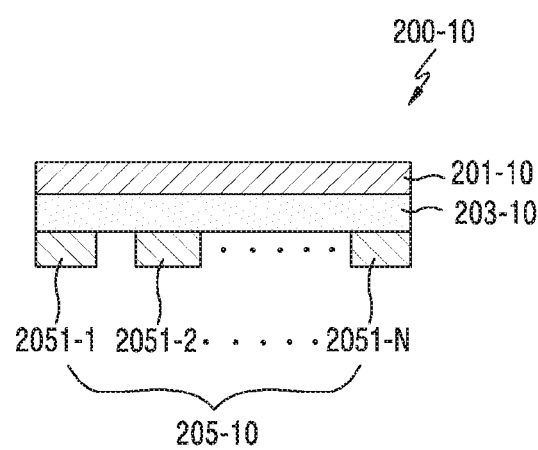

FIG. 18 is a view illustrating a capacitance generating device according to various embodiments of the present disclosure.

Referring to FIG. 18, the capacitance generating device 200-10 may include a first metal plate 201-10, a dielectric member 203-10, and a second metal plate 205-10. The dielectric member 203-10 may be interposed between the first metal plate 201-10 and the second metal plate 205-10.

According to an embodiment of the present disclosure, the second metal plate 205-10 may include a plurality of sub-metal plates 2051-1 to 2051-N.

According to an embodiment of the present disclosure, the plurality of sub-metal plates 2051-1 to 2051-N of the second metal plate 205-10 may be physically separated from each other.

According to an embodiment of the present disclosure, the plurality of sub-metal plates 2051-1 to 2051-N of the second metal plate 205-10 may have the same length or different lengths.

According to an embodiment of the present disclosure, the plurality of sub-metal plates 2051-1 to 2051-N of the second metal plate 205-10 may have the same thickness or different thicknesses.

According to an embodiment of the present disclosure, the gaps between the plurality of sub-metal plates 2051-1 to 2051-N of the second metal plate 205-10 may be equal or unequal.

According to an embodiment of the present disclosure, the plurality of sub-metal plates 2051-1 to 2051-N of the second metal plate 205-10 may contain the same material or different materials.

According to an embodiment of the present disclosure, each of the plurality of sub-metal plates 2051-1 to 2051-N of the second metal plate 205-10 may have an extension electrically connected to the substrate 130. For example, at least one of the extensions of the plurality of sub-metal plates 2051-1 to 2051-N of the second metal plate 205-10 may be electrically connected to the power feeder of the substrate 130. Alternatively, at least one of the extensions of the plurality of sub-metal plates 2051-1 to 2051-N of the second metal plate 205-10 may be electrically connected to the ground unit of the substrate 130.

Figure 19:
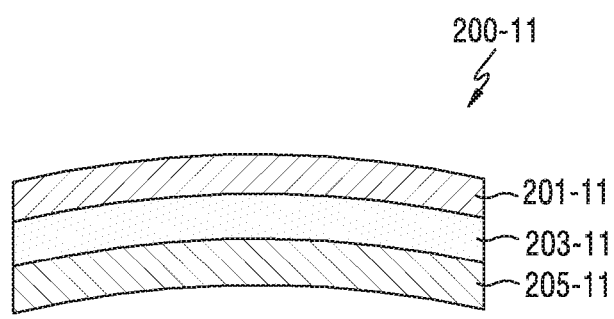

FIG. 19 is a view illustrating a capacitance generating device according to various embodiments of the present disclosure.

Referring to FIG. 19, the capacitance generating device 200-11 may include a first metal plate 201-11, a dielectric member 203-11, and a second metal plate 205-11. The dielectric member 203-11 may be interposed between the first metal plate 201-11 and the second metal plate 205-11.

According to an embodiment of the present disclosure, the capacitance generating device 200-11 may have a substantially curved shape.

According to various embodiments of the present disclosure, the capacitance generating device may include a plurality of (e.g., two or more) metal plates and at least one dielectric member disposed therebetween.

Figure 20:
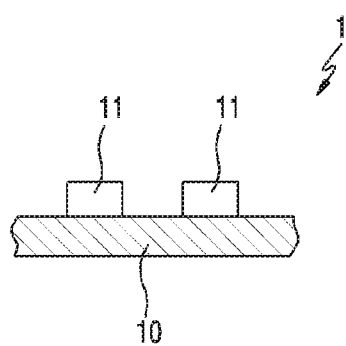
FIG. 20 is a view illustrating a capacitor for preventing an electric shock due to an over-current in an electronic device in the related art.

FIG. 20 is a view illustrating a capacitor for preventing an electric shock due to an over-current in an electronic device in the related art.

Referring to FIG. 20, the electronic device 1, according to the related art, may include capacitors 11 on a substrate 10 in order to prevent: antenna radiating performance degradation generated by implementing a part of the external appearance with metal; damage to the product and an electric shock due to an over-current; and the like. In the electronic device 1, two capacitors 11 may be generally mounted on the substrate 10 in consideration of damage to the capacitors 11 due to an external shock or static electricity. However, in a case where the electronic device 1 is charged while the two capacitors 11 are all damaged, an over-current may be introduced into the electronic device 1 from the outside (e.g., a charging device, etc.) to cause damage to the product and to cause an electric shock.

As described above, the capacitance generating device 200, according to the various embodiments of the present disclosure, can prevent damage to the product and an electric shock that are caused by an over-current that may occur while the battery 140 is being recharged.

Figure 21:
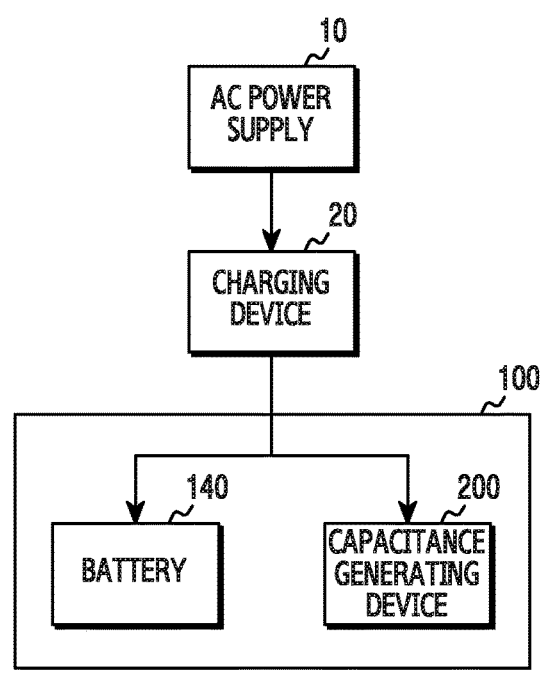
FIG. 21 is a block diagram for preventing an electric shock due to an over-current in an electronic device according to various embodiments of the present disclosure.

FIG. 21 is a block diagram for preventing an electric shock due to an over-current in an electronic device according to various embodiments of the present disclosure.

Referring to FIG. 21, a charging device (TA) 20 may receive an alternating current (AC) current from an AC power supply 10 (e.g., an electrical outlet) and may rectify the supplied AC current to a relatively low-voltage DC current to provide the DC current to the electronic device 100. The charging device 20 may use a capacitor in the process of rectifying the AC current, which is supplied from the AC power supply 10, to the low-voltage DC current. However, in a case where the capacitor is damaged, the high-voltage AC current supplied from the AC power supply 10 may directly enter the electronic device 10 without being rectified to a DC current. But the high-voltage AC current can be rectified to a low-voltage current according to the capacitor structure of the capacitance generating device 200 of the present disclosure, thereby preventing damage due to an over-current.

According to various embodiments, an electronic device may include: a first metal plate of a metal bezel that forms the external appearance of the electronic device; a second metal plate that overlaps the first metal plate while being spaced apart from the first metal plate; a dielectric member interposed between the first metal plate and the second metal plate; and a substrate electrically connected to a contact terminal of the second metal plate to feed power.

The first metal plate may be cut off at opposite ends thereof in a section of the metal bezel.

The first metal plate may include a plurality of sub-metal plates.

The plurality of metal plates may have the same width or different widths.

The plurality of metal plates may have the same thickness or different thicknesses.

The gaps between the plurality of sub-metal plates may be equal to, or different from, each other.

Each of the plurality of sub-metal plates may be electrically connected to at least one power feeder of the substrate through at least one electrical connection means.

The first metal plate may include a plurality of sub-metal plates that are disposed to overlap each other.

The second metal plate may include a plurality of sub-metal plates.

The plurality of metal plates may have the same width or different widths.

The plurality of metal plates may have the same thickness or different thicknesses.

The gaps between the plurality of sub-metal plates may be equal to, or different from, each other.

Each of the plurality of sub-metal plates may be electrically connected to at least one power feeder of the substrate through at least one electrical connection means.

The second metal plate may include a plurality of sub-metal plates that are disposed to overlap each other.

The dielectric member may include a plurality of sub-dielectric members.

The plurality of sub-dielectric materials may contain different materials or the same material.

The dielectric member may include at least a part of a case frame coupled to the metal bezel.

The dielectric member may include a plurality of sub-dielectric members that are disposed to overlap each other.

The first metal plate and the dielectric member may be coupled to each other using a coupling structure between a groove and a protrusion.

The second metal plate and the dielectric member may be coupled to each other using a coupling structure between a groove and a protrusion.

The first metal plate may be electrically connected to the ground unit of the substrate.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a first metal plate configured to form at least a part of a metal bezel which is a rim of a housing of the electronic device, the first metal plate being connected to a ground;
a second metal plate extending along a part of inner circumference of the metal bezel, facing the first metal plate, and comprising a contact terminal;
a dielectric member interposed between the first metal plate and the second metal plate; and
a substrate electrically connected through the contact terminal,
wherein a capacitance is generated by the first metal plate, the second metal plate, and the dielectric member in response to receiving, at the second metal plate, a current through the contact terminal from the substrate, and
wherein the first metal plate, the second metal plate, and the dielectric member form at least a part of an antenna of the electronic device, and the capacitance is a factor that determines a resonance of the antenna.

2. The electronic device of claim 1, wherein the substrate comprises at least one power feeder configured to supply a current to at least one of the first metal plate or the second metal plate.

3. The electronic device of claim 1, wherein the second metal plate comprises a plurality of sub-metal plates.

4. The electronic device of claim 3, wherein each of the plurality of sub-metal plates comprises a same width or a different width.

5. The electronic device of claim 3, wherein each of the plurality of sub-metal plates comprises a same thickness or a different thickness.

6. The electronic device of claim 3, wherein gaps between each of the plurality of sub-metal plates are equal to or different from each other.

7. The electronic device of claim 3, wherein each of the plurality of sub-metal plates is electrically connected to at least one power feeder of the substrate through at least one electrical connection.

8. The electronic device of claim 1, wherein the second metal plate comprises a plurality of sub-metal plates that are disposed to overlap each other.

9. The electronic device of claim 1, wherein the dielectric member comprises a plurality of sub-dielectric members.

10. The electronic device of claim 9, wherein each of the plurality of sub-dielectric members comprises a same material or a different material.

11. The electronic device of claim 1, wherein the dielectric member comprises at least a part of a case frame coupled to the metal bezel.

12. The electronic device of claim 1, wherein the dielectric member comprises a plurality of sub-dielectric members that are disposed to overlap each other.

13. The electronic device of claim 1, wherein the first metal plate comprises at least one groove, and the dielectric member is coupled to the first metal plate through the groove.

14. The electronic device of claim 1, wherein the second metal plate comprises at least one groove, and the dielectric member is coupled to the second metal plate through the groove.

* * * * *